United States Patent
Suehiro

(10) Patent No.: US 8,213,559 B2
(45) Date of Patent: Jul. 3, 2012

(54) PARALLEL SAMPLING DEVICE, PARALLEL SAMPLING METHOD, RECEIVING DEVICE, AND RECEIVING METHOD

(76) Inventor: Naoki Suehiro, Tsukuba (JP)

( * ) Notice: Subject to any disclaimer, the term of this patent is extended or adjusted under 35 U.S.C. 154(b) by 297 days.

(21) Appl. No.: 12/601,929

(22) PCT Filed: Jun. 19, 2008

(86) PCT No.: PCT/JP2008/061588
§ 371 (c)(1),
(2), (4) Date: Nov. 25, 2009

(87) PCT Pub. No.: WO2009/001877
PCT Pub. Date: Dec. 31, 2008

(65) Prior Publication Data
US 2010/0177849 A1    Jul. 15, 2010

(30) Foreign Application Priority Data
Jun. 28, 2007    (JP) .................. 2007-170893

(51) Int. Cl.
*H04L 7/00* (2006.01)
(52) U.S. Cl. ........................ 375/355; 375/316
(58) Field of Classification Search .......... 375/316, 375/350, 355; 341/899
See application file for complete search history.

(56) References Cited

U.S. PATENT DOCUMENTS

| | | | | |
|---|---|---|---|---|
| 5,490,174 A * | 2/1996 | Shin et al. | ...... | 375/316 |
| 6,269,117 B1 * | 7/2001 | Peng | ...... | 375/232 |
| 6,359,577 B1 * | 3/2002 | Weigel | ...... | 341/147 |
| 6,674,822 B1 * | 1/2004 | Legrand et al. | ...... | 375/355 |
| 6,711,221 B1 | 3/2004 | Belotserkovsky et al. | | |
| 2007/0086544 A1 * | 4/2007 | Fudge et al. | ...... | 375/316 |
| 2007/0248189 A1 * | 10/2007 | Ishikawa et al. | ...... | 375/332 |
| 2010/0040162 A1 | 2/2010 | Suehiro | | |

FOREIGN PATENT DOCUMENTS

| | | |
|---|---|---|
| JP | 07-074793 A | 3/1995 |
| JP | 2001-268041 A | 9/2001 |
| JP | 2005-303386 A | 10/2005 |
| WO | 2007/139119 A1 | 12/2007 |
| WO | 2008/126644 A1 | 10/2008 |

OTHER PUBLICATIONS

Written Opinion (PCT/ISA/237) with English translation of PCT/JP2008/061588, mailing date of Sep. 16, 2008.
International Search Report of PCT/JP2008/061588, mailing date of Sep. 16, 2008.

* cited by examiner

*Primary Examiner* — Jean B Corrielus
(74) *Attorney, Agent, or Firm* — Westerman, Hattori, Daniels & Adrian, LLP

(57) ABSTRACT

A parallel sampling device includes a memory that stores the values of the sampling function (Sin πt/πt), a low pass filter, a sampler that samples a signal, which has passed through low pass filter, at a sampling period of Ts, and a parallel sampler provided in a stage following the sampler. The parallel sampler generates parallel sampled values at an interval of the sampling period Ts/N (N is a natural number equal to or larger than 2) based on sampled values obtained by the sampler and the values of the sampling function stored in the memory. This configuration allows parallel sampling to be performed easily even if the frequency is high or the sampling period of parallel sampling is narrow.

9 Claims, 12 Drawing Sheets

FIG. 10A   SIGNAL P (1, −1, 1, 1)
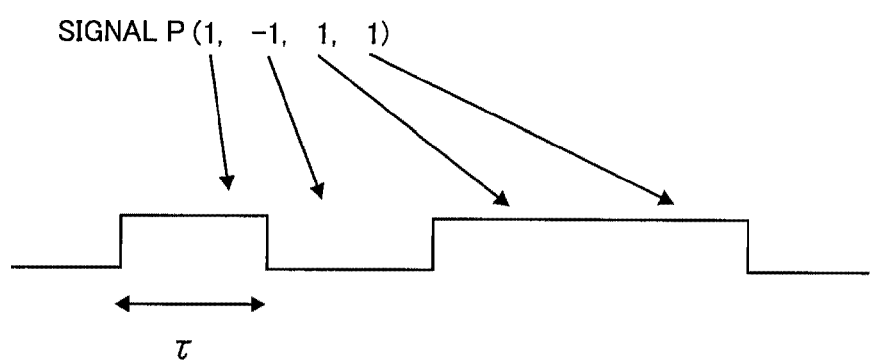
FIG. 10B   OVERSAMPLING AT AN INTERVAL OF $\tau/4$
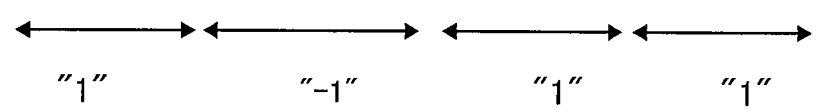
SIGNAL B (1, 1, 1, 1, −1, −1, −1, −1, 1, 1, 1, 1, 1, 1, 1, 1)
"1"   "−1"   "1"   "1"

| | | | | |
|---|---|---|---|---|
| SEQUENCE OF SAMPLING POINT #0 | $a_{0\text{-}0}$ | $a_{1\text{-}0}$ | $\cdots$ | $a_{(M-1)\text{-}0}$ |
| SEQUENCE OF SAMPLING POINT #1 | $a_{0\text{-}1}$ | $a_{1\text{-}1}$ | $\cdots$ | $a_{(M-1)\text{-}1}$ |
| SEQUENCE OF SAMPLING POINT #U-1 | $a_{0\text{-}(U-1)}$ | $a_{1\text{-}(U-1)}$ | $\cdots$ | $a_{(M-1)\text{-}(U-1)}$ |

FIG. 12

PARALLEL SAMPLING DEVICE, PARALLEL SAMPLING METHOD, RECEIVING DEVICE, AND RECEIVING METHOD

TECHNICAL FIELD

The present invention relates to a parallel sampling device, a parallel sampling method, a receiving device, and a receiving method.

BACKGROUND ART

The technology for oversampling the I signal and the Q signal from modulated signals for correcting a phase lag in the I signal and the Q signal (see Patent Document 1) and the technology for oversampling the OFDM signal or the television signal for a receiver to receive the reception signals have been developed (see Patent Documents 2 and 3).

[Patent Document 1] Japanese Patent Laid-Open Publication No. 2005-303386

[Patent Document 2] Japanese Patent Laid-Open Publication No. 2001-268041

[Patent Document 3] Japanese Patent Laid-Open Publication No. 2005-303386

DISCLOSURE OF THE INVENTION

Problems to be Solved by the Invention

However, the problem is that it becomes difficult to perform oversampling when the frequency of the signal to be processed is high or the sampling period of oversampling is narrow.

In view of the foregoing, it is an object of the present invention to provide a parallel sampling device and method capable of easily performing oversampling even if the frequency is high or the sampling period of oversampling is narrow.

Means to Solve the Problems

To achieve the above objects, a parallel sampling device of the present invention comprises a memory that stores values of a sampling function (Sin $\pi t/\pi t$); a low pass filter or a band pass filter; sampling means that performs first sampling for a signal, which has passed through the low pass filter or the band pass filter, at a sampling period of Ts; and parallel sampled value generation means provided in a stage following the sampling means wherein, based on a first sampled value obtained by the sampling means and the values of the sampling function stored in the memory, the parallel sampled value generation means generates a second sampled value of second sampling at a sampling period of Ts.

Parallel sampling is the process of further sampling the same sampling period using the sampled result to produce a result equivalent to oversampling.

Oversampling is performed by oversampling a signal once while parallel sampling is performed first by sampling a signal and, using the result of the first sampling, by further generating the sampled value of the same sampling period. The result of the first sampling and the result of the parallel sampling are combined to produce a result equivalent to that of oversampling.

To achieve the above objects, a parallel sampling method of the present invention comprises a filter step of performing LPF processing or BPF processing for a signal to be sampled; a sampling step of performing first sampling for the signal, which has passed through the filter step, at a sampling period of Ts; and a parallel sampled value generation step of generating a second sampled value of second sampling at a sampling period of Ts, based on values of a sampling function stored in a sampling function memory and a first sampled value obtained by the sampling step.

To achieve the above objects, a receiving device of the present invention comprises receiving means that receives a radio frequency signal from a sending device and converts the signal to a baseband reception signal; a memory that stores values of a sampling function; a low pass filter or a band pass filter to which an output of the receiving means is supplied; sampling means that performs first sampling for a reception signal, which has passed through the low pass filter or the band pass filter, at a sampling period of Ts; parallel sampled value generation means provided in a stage following the sampling means; and signal regeneration means provided in a stage following the parallel sampled value generation means wherein based on a first sampled value obtained by the sampling means and the values of the sampling function stored in the memory, the parallel sampled value generation means generates a second sampled value of second sampling at a sampling period of Ts and the signal regeneration means regenerates a signal based on the first sampled value and the second sampled value.

To achieve the above objects, a receiving method of the present invention comprises a reception step of receiving a radio frequency signal from a sending device and converting the signal to a baseband reception signal; filter step of performing LPF processing or BPF processing for the reception signal that has been converted to the baseband reception signal by the reception step; a sampling step of performing first sampling for the signal, which has passed through the filter step, at a sampling frequency of Ts; a parallel sampled value generation step of generating a second sampled value of second sampling at a sampling frequency of Ts, based on values of a sampling function stored in a sampling function memory and a first sampled value obtained by the sampling step; and a signal regeneration step of regenerating a signal based on the first sampled value and the second sampled value.

EFFECT OF THE INVENTION

The present invention provides a parallel sampling device, a parallel sampling method, a receiving device, and a receiving method that can easily perform oversampling even if the frequency is high or the sampling period of oversampling is narrow.

BRIEF DESCRIPTION OF THE DRAWINGS

FIGS. 10A and 10B are diagrams showing oversampling;
FIG. 12 is a diagram showing virtual channels based on oversampling (2).

BEST MODE FOR CARRYING OUT THE INVENTION (Sampling Theorem)

Figure 1:
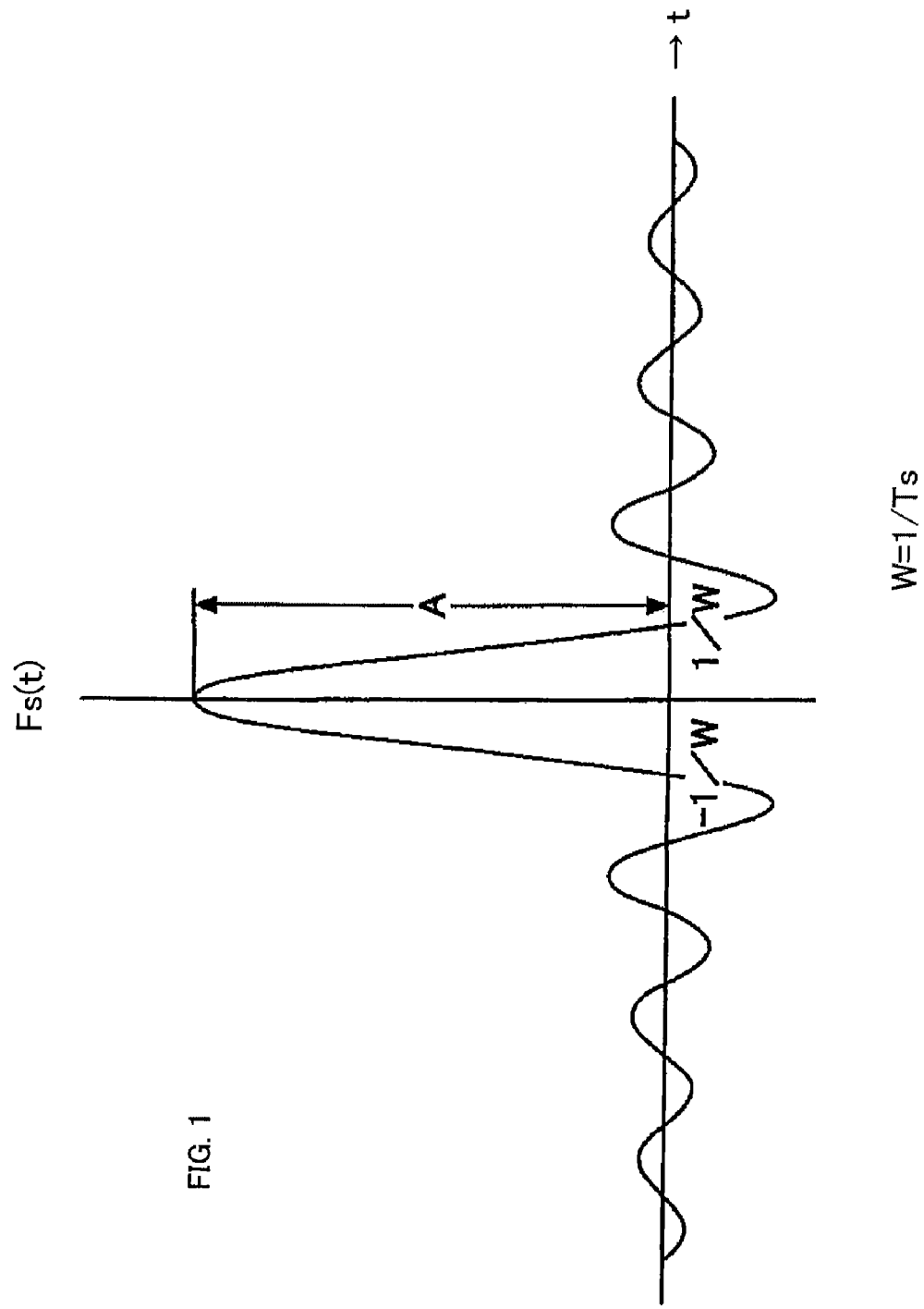
FIG. 1 is a diagram showing the sampling function.

FIG. 1 shows the sampling function Fs(t). The sampling function Fs(t) is represented by expression (1) given below.

$$Fs(t) = A \sin 2\pi Wt / 2\pi Wt \quad (1)$$

This sampling function Fs(t)
has the amplitude value of A when t=0 and
has the value of 0 when t=±1/W, ±2/W, ±3/W, . . . .

In the above expression, W=1/Ts where Ts is the sampling period.

Using the sampling function Fs(t), the signal x(t), the band of which is limited to the frequency W/2 or lower, may be represented by the sampling theorem as follows.

$$x(t) = \sum_{k=-\infty}^{\infty} x(kTs) \frac{\sin[\pi W(t-kTs)]}{\pi(t-kT)} \quad (2)$$

where, x(kTs) is the sampled value of x(t) sampled at a sampling interval of Ts.

That is, the signal x(t) may be represented by the value of the sampling function Fs(t) of each sampling interval Ts and the sampled value of each sampling interval Ts.

Figure 2:
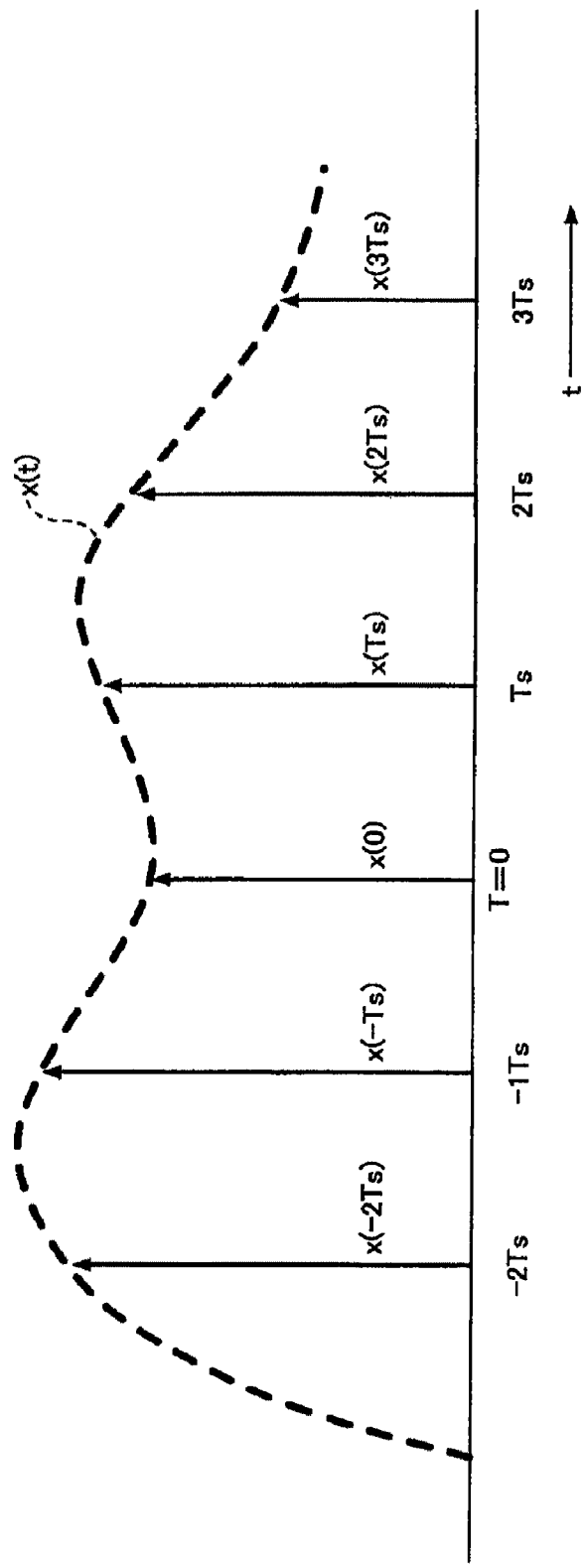
FIG. 2 is a diagram showing sampling.
Figure 3:
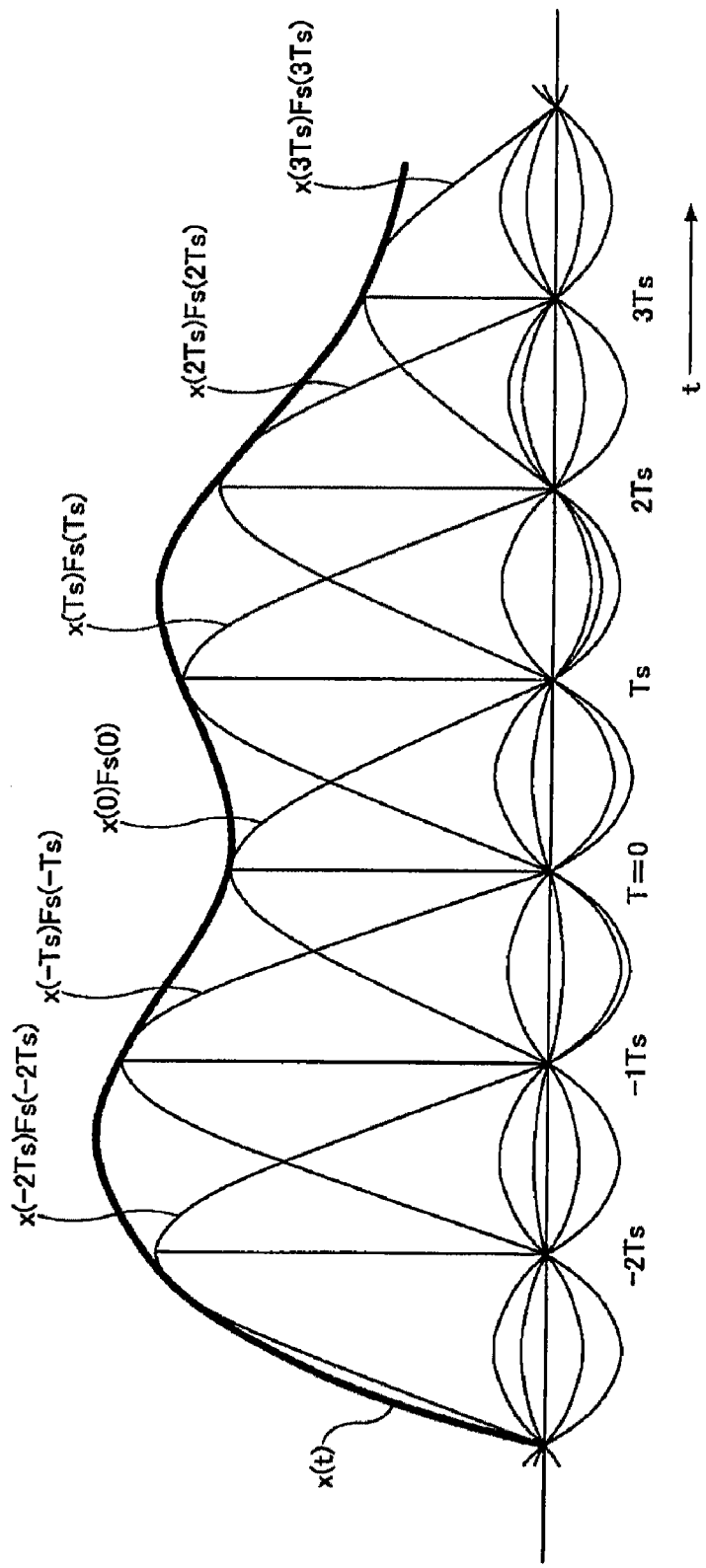
FIG. 3 is a diagram showing that the signal may be reproduced by sampled values and the sampling function.

The following describes this signal with reference to FIG. 2 and FIG. 3.

FIG. 2 is a diagram showing that the signal x(t) is sampled at a sampling interval of Ts ( . . . −2Ts, −Ts, 0, Ts, 2Ts, . . . ) and the sampled values ( . . . x(−2Ts), x(−Ts), x(0), x(Ts), x(2Ts), x(3Ts), . . . ) are obtained.

As shown in FIG. 3, expression (2) indicates that x(t) is the sum of . . . , x(−2Ts)Fs(−2Ts), x(−Ts)Fs(−Ts), x(0)Fs(0), x(Ts)Fs(Ts), x(2Ts)Fs(2Ts), x(3Ts)Fs(3Ts) . . . .

(Parallel Sampling Device)

Figure 4:
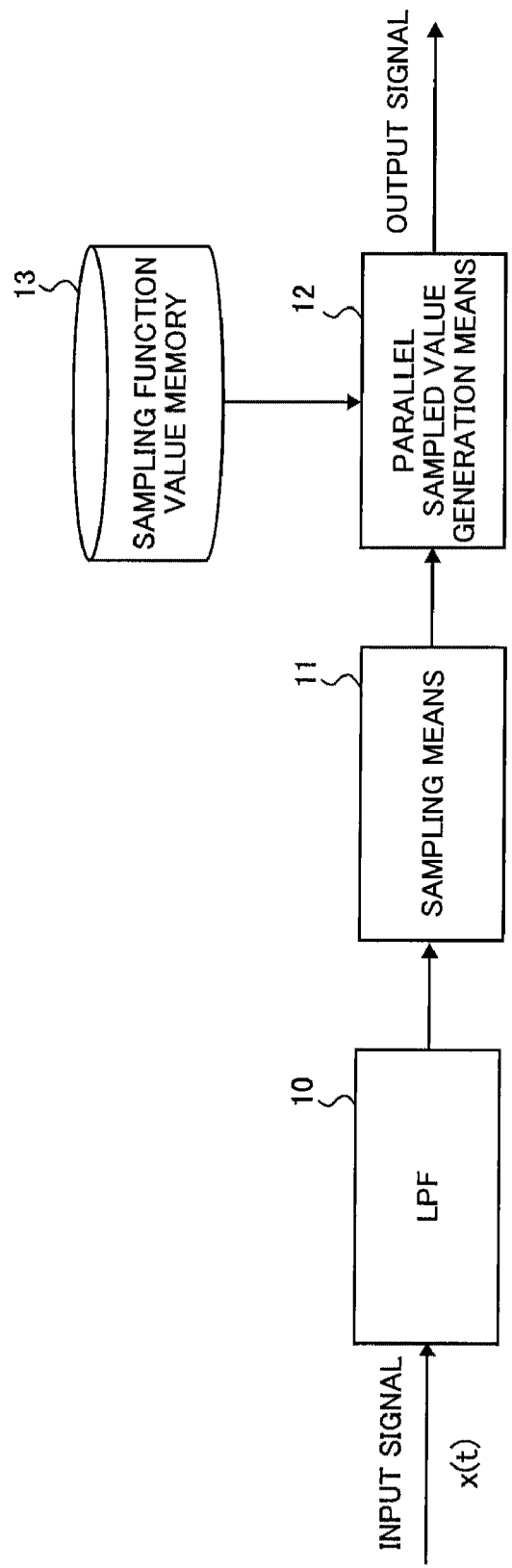
FIG. 4 is a diagram showing a parallel sampling device.

FIG. 4 shows an example of a parallel sampling device.

The parallel sampling device in FIG. 4 comprises an LPF (Low Pass Filter) 10, sampling means 11, parallel sampling means, and sinc function (sampling function) memory 13. A BPF (Band Pass Filter) may be used instead of the LPF.

The LPF 10 blocks signals, which have a frequency higher than a predetermined frequency $f_1$, from the applied signals and lets signals, which have a frequency equal to or lower than the frequency $f_1$, pass through.

The sampling means 11 samples the signals, which have passed through the LPF 10, at an interval equal to or lower than the sampling frequency $\frac{1}{2}f_1$ and outputs the sampling frequency and the sampled values to the parallel sampling means 12.

The parallel sampling means performs parallel sampling based on the sampling frequency and the sampled values, received from the sampling means 11, and the sinc function stored in the sinc function memory 13.

Parallel sampling need not be performed at an equal interval. For ease of explanation, the following describes the parallel sampling at an equal interval.

Figure 5:
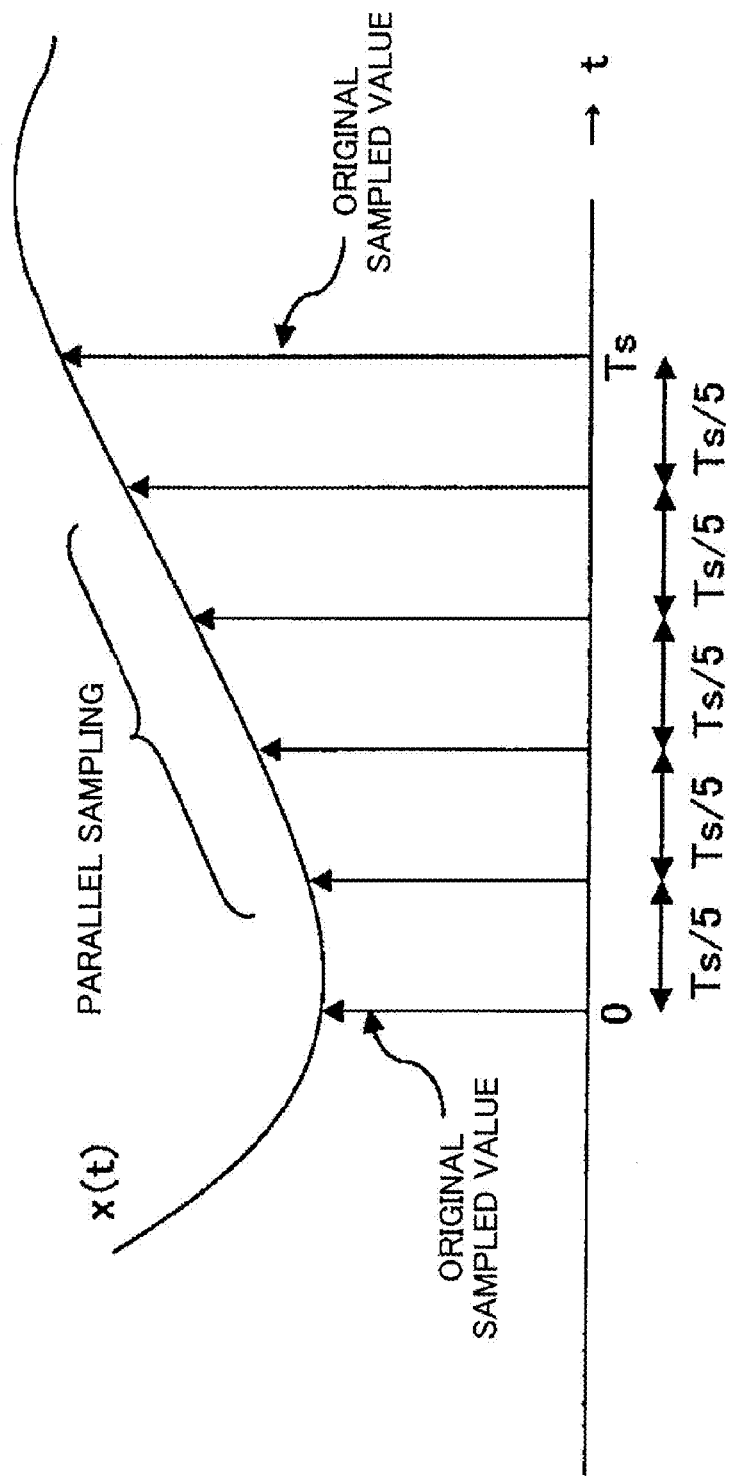
FIG. 5 is a diagram showing parallel sampling (1)

When the original sampling period is Ts, parallel sampling is performed at a Ts/5 sampling interval to obtain five times more oversampled values, as shown in FIG. 5.

Figure 6:
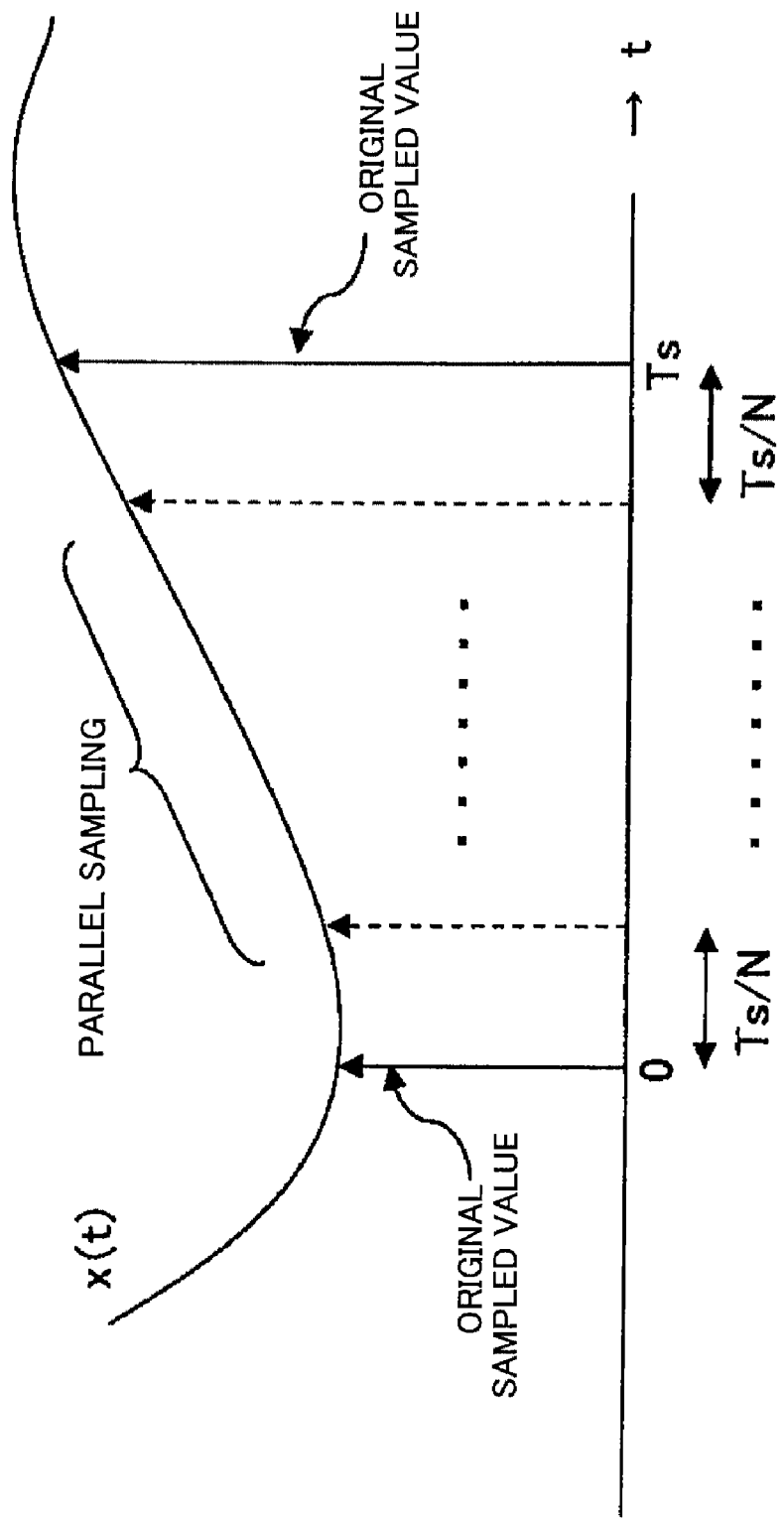
FIG. 6 is a diagram showing parallel sampling (2)

As shown in FIG. 6, N-times oversampling requires that parallel sampling be performed at a Ts/N sampling periodic interval.

Meanwhile, x(t) may be reproduced by the sampled values and the sampling function Fs(t) as shown in FIG. 3.

This means that the parallel sampled values may also be obtained from x(t) reproduced by the sampled values and the sampling function Fs(t).

Figure 7:
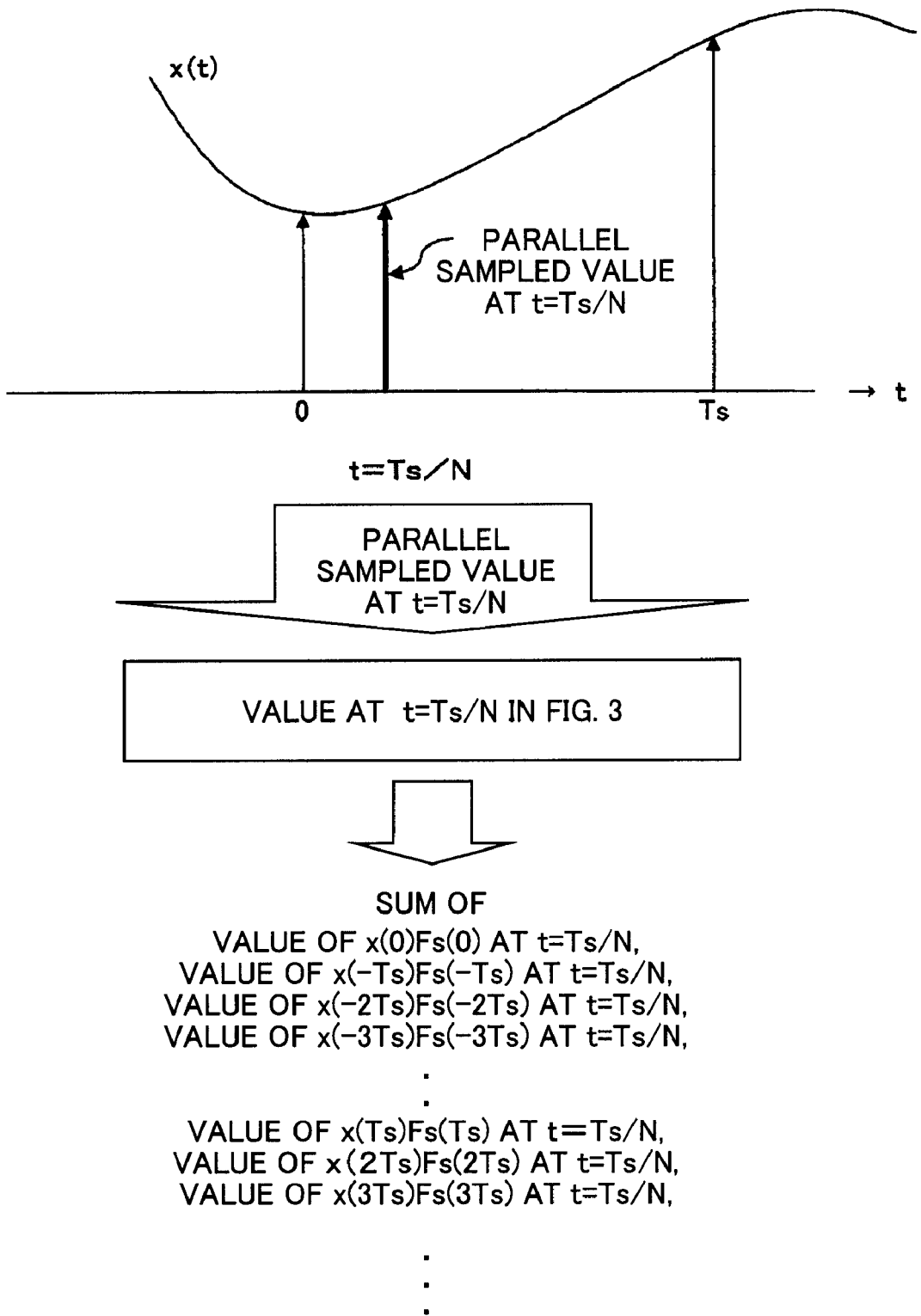
FIG. 7 is a diagram showing that the parallel sampled value may be obtained by sampled values and the sampling function.

For example, when N-times oversampling is performed, the parallel sampled value at the sampling point (Ts/N), which immediately follows the original sampling point, may be represented by the sum of the following as shown in FIG. 7.

Value of x(0)Fs(0) at t=Ts/N,
Value of x(−Ts)Fs(−Ts) at t=Ts/N,
Value of x(−2Ts)Fs(−2Ts) at t=Ts/N,
Value of x(−3Ts)Fs(−3Ts) at t=Ts/N,
•
•
•
Value of x(Ts)Fs(Ts) at t=Ts/N,
Value of x(2Ts)Fs(2Ts) at t=Ts/N,
Value of x(3Ts)Fs(2Ts) at t=Ts/N,
•
•
•

When normalized in terms of Fs(0) considering that the sampling function Fs(t) is an even function, the parallel sampled value at the sampling point (Ts/N), which immediately follows the original sampling point, may be represented by the sum of the following.

Value of x(0)Fs(0) at t=Ts/N,
Value of x(−Ts)Fs(0) at t=Ts+Ts/N,
Value of x(−2Ts)Fs(0) at t=2Ts+Ts/N,
Value of x(−3Ts)Fs(0) at t=3Ts+Ts/N,
•
•
•
Value of x(Ts) Fs(0) at t=Ts−Ts/N,
Value of x(2Ts)Fs(0) at t=2Ts−Ts/N,
Value of x(3Ts)Fs(0) at t=3Ts−Ts/N,
•
•
•

Similarly, the values at other parallel sampling points may be obtained by the sampled values and the sampling function Fs(t).

Figure 8:
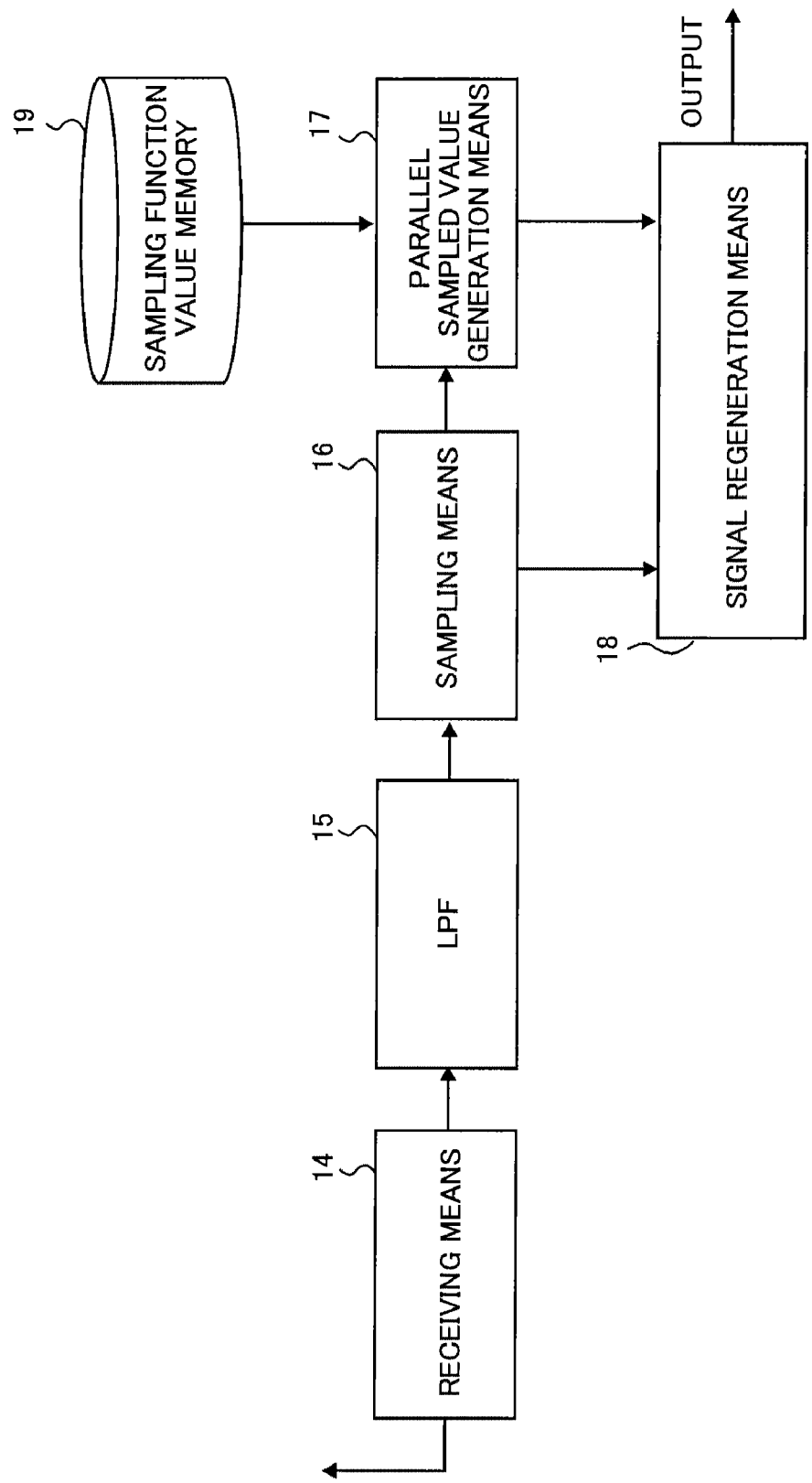
FIG. 8 is a diagram showing a receiving device.

Next, the following describes an example of a receiving device, which performs parallel sampling, with reference to FIG. 8.

The receiving device shown in FIG. 8 comprises receiving means 14, an LPF 15, sampling means 16, parallel sampled value generation means 17, signal regeneration means 18, and a sampling function value memory 19.

The receiving means 14 receives the radio frequency signal from a sending device and converts the high-frequency reception signal to a baseband reception signal.

The LPF 15 receives the baseband signal and removes the high-frequency components with a frequency equal to or higher than $f_0$.

The sampling means 16 samples the output of the LPF 15 at a sampling period of Ts. The sampling frequency (=1/Ts) must be a frequency equal to or higher than $2f_0$.

The parallel sampled value generation means 17 generates the parallel sampled value at the sampling frequency of Ts in the same method as described in FIG. 4 based on the sampled value obtained by the sampling means 16 and the values of the sampling function stored in the sampling function value memory 19.

The signal regeneration means 18 regenerates the signal based on the sampled value output by the sampling means 16 and the parallel sampled value generated by the parallel sampled value generation means 17.

A BPF may be used instead of the LPF 15.

Figure 9:
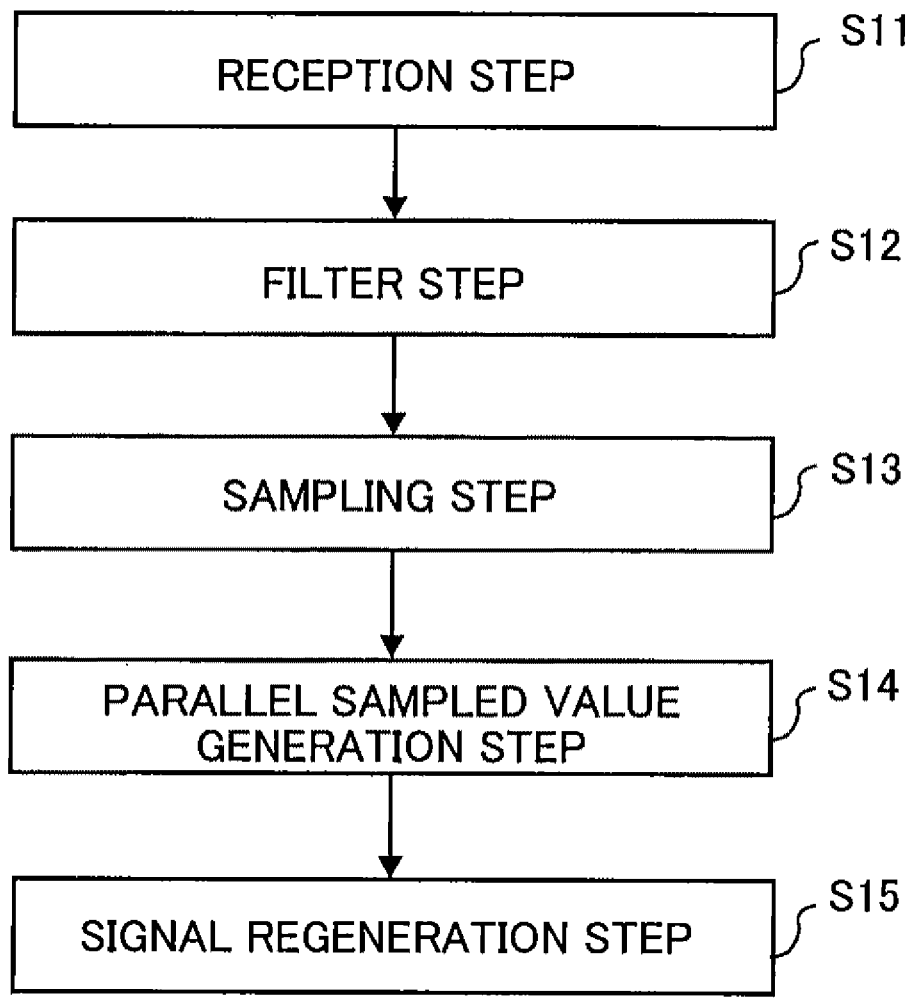
FIG. 9 is a diagram showing a receiving method.

Next, the following describes an example of the reception method for parallel sampling with reference to FIG. 9.

The receiving method shown in FIG. 9 comprises a reception step S11 that receives the radio frequency signal from a sending device and converts the received signal to a baseband reception signal; a filter step S12 that performs LPF processing or BPF processing for the reception signal converted to a baseband reception signal in the reception step S11; a sampling step S13 that samples the signal, which has passed through the filter step S12, at a sampling period of Ts; a parallel sampled value generation step S14 that generates a parallel sampled value at the sampling frequency of Ts based on the sampling function values, stored in the sampling function memory, and the sampled value obtained in the sampling step S13; and a signal regeneration step S15 that regenerates the signal based on the sampled value obtained by the sampling step S13 and the parallel sampled value obtained by the parallel sampled value generation step S14.

The invention of this application may be applied not only to the general oversampling but also to the oversampling of the inventions proposed by the inventor of the present invention and disclosed in Japanese Patent Application No. 2006-153430, Japanese Patent Application No. 2006-181372, Japanese Patent Application No. 2007-47576, and Japanese Patent Application No. 2007-103078.

Next, the following describes the virtual channels implemented by the oversampling described in those applications.
(Oversampling)

First, the following describes the oversampling of the signal P(1,−1,1,1) with reference to FIG. 10. As shown in FIG. 10(A), when the pitch interval of the signal P is σ (pitch frequency 1/σ), the oversampling with a frequency four time higher than the pitch frequency (that is, at an interval of σ/4) produces the signal shown in FIG. 10(B).

That is, the signal A(1,−1,1,1) becomes the signal B(1,1,1, 1,−1−1−1−1,1,1,1,1,1,1,1,1).

Note that, if the time at which oversampling is performed is fixed, the intervals of oversampling need not be the same.

In the description below, it is assumed that there are lines, one for each sampling of the oversampling.

Figure 11:
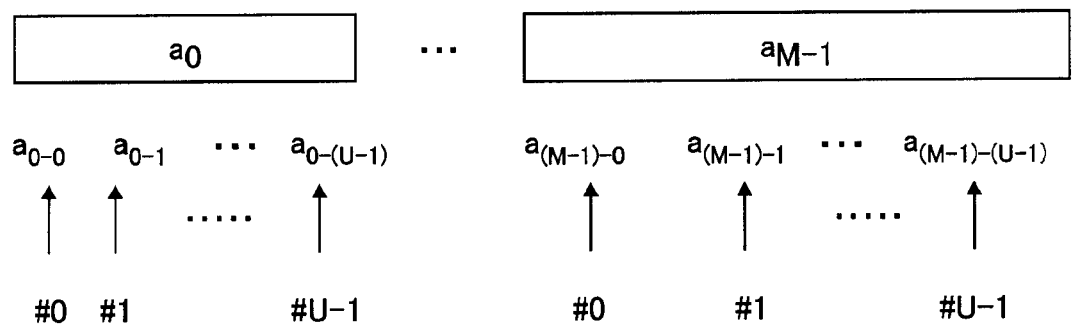
FIG. 11 is a diagram showing virtual channels based on oversampling (1)

As shown in FIG. 11, the signals ($a_0, a_1, a_{(M-1)}$) are received and oversampled. In the description below, the signal of oversampling #1 for the signal $a_0$ is indicated by $a_{0-1}$, the signal of oversampling #2 for the signal $a_0$ is indicated by $a_{0-2}$, ..., the signal of oversampling #M for the signal $a_0$ is indicated by $a_{0-M}$, the signal of oversampling #1 for the signal $a_1$ indicated by is $a_{1-1}$, the signal of oversampling #2 for the signal $a_1$ is indicated by $a_{1-2}$, ..., the signal of oversampling #M for the signal $a_1$ is indicated by $a_{1-M}$, ..., the signal of oversampling #1 for the signal $a_{(M-1)}$ is indicated by $a_{(M-1)-1}$, the signal of oversampling #2 for the signal $a_{(M-1)}$ is indicated by $a_{(M-1)-2}$, ..., and the signal of oversampling #M for the signal $a_{(M-1)}$ is indicated by $a_{(M-1)-M}$.

Those oversampled signals are arranged into the following sequences based on the sampling points as shown in FIG. 3.
Sequence of sampling point #0 $a_{0-0}\ a_{1-0}\ \ldots\ a_{(M-1)-0}$
Sequence of sampling point #1 $a_{0-1}\ a_{1-1}\ \ldots\ a_{(M-1)-1}$
...
Sequence of sampling point #U-1 $a_{0-(U-1)}\ a_{1-(U-1)}\ \ldots\ a_{(M-1)-(U-1)}$ The above sequences indicate that there are signal sequences corresponding to the sending signals for the sampling points, one signal sequence for each sampling point; in other words, there are virtual channels, one for each sampling point.

Although the sampling function is used in the above description, commonly used interpolation functions (for example, spline function, Lagrange function, raised cosine function, etc.) may also be used if accurate parallel sampling is not required.

INDUSTRIAL APPLICABILITY

While the best embodiments for carrying out the present invention have been described, it is to be understood that the present invention is not limited to the embodiments described above. Various changes may be made in the scope without departing from the spirit of the present invention.

The invention claimed is:

1. A parallel sampling device comprising:
a memory that stores values of a sampling function(Sin πt/πt);
a low pass filter or a band pass filter;
a sampler that performs first sampling for a signal, which has passed through the low pass filter or the band pass filter, at a sampling period of Ts; and
a parallel sampled value generator provided in a stage following said sampler, wherein
based on a first sampled value obtained by said sampler and the values of the sampling function stored in said memory, said parallel sampled value generator generates a second sampled value of second sampling at said sampling period of Ts.

2. The parallel sampling device according to claim 1, wherein
said memory stores the values of the sampling function at an interval of ΔT which is $T_s/N \times M$, where N is an integer equal to or larger than 2 and M is an integer equal to or larger than 1, and
when the second sampling is a plurality of samplings performed at an interval of Ts/N,
said parallel sampled value generator generates the second sampled value based on the first sampled value and the values of the sampling function at t=±Ts/N, ±2Ts/N, ±3Ts/N, . . . .

3. A parallel sampling method comprising:
a filter step of performing Low Pass Filter processing or Band Pass Filter processing for a signal to be sampled;
a sampling step of performing first sampling for the signal, which has passed through said filter step, at a sampling period of Ts; and
a parallel sampled value generation step of generating a second sampled value of second sampling at said sampling period of Ts, based on values of a sampling function stored in a sampling function memory and a first sampled value obtained by said sampling step.

4. The parallel sampling method according to claim 3, wherein
said memory stores the values of the sampling function at an interval of ΔT which is $T_s/N \times M$, where N is an integer equal to or larger than 2 and M is an integer equal to or larger than 1, and
when the second sampling is a plurality of samplings performed at an interval of Ts/N,
said parallel sampled value generation step generates the second sampled value based on the first sampled value and the values of the sampling function at t=±Ts/N, ±2Ts/N, ±3Ts/N, . . . .

5. A receiving device comprising:
a receiver that receives a radio frequency signal from a sending device and converts the signal to a baseband reception signal;
a memory that stores values of a sampling function;

a low pass filter or a band pass filter to which an output of said receiver is supplied;

a sampler that performs first sampling for a reception signal, which has passed through the low pass filter or the band pass filter, at a sampling period of Ts;

a parallel sampled value generator provided in a stage following said sampler; and a signal regenerator provided in a stage following said parallel sampled value generator wherein based on a first sampled value obtained by said sampler and the values of the sampling function stored in said memory, said parallel sampled value generates a second sampled value of second sampling at said sampling period of Ts, and said signal regenerator regenerates a signal based on the first sampled value and the second sampled value.

6. A receiving method comprising:

a reception step of receiving a radio frequency signal from a sending device and converting the signal to a baseband reception signal;

filter step of performing Low Pass Filter processing or Band Pass Filter processing for the reception signal that has been converted to the baseband reception signal by said reception step;

a sampling step of performing first sampling for the signal, which has passed through said filter step, at a sampling frequency of Ts;

a parallel sampled value generation step of generating a second sampled value of second sampling at a sampling frequency of Ts, based on values of a sampling function stored in a sampling function memory and a first sampled value obtained by said sampling step; and a signal regeneration step of regenerating a signal based on the first sampled value and the second sampled value.

7. A parallel sampling device comprising:

a memory that stores values of an interpolation function;

a low pass filter or a band pass filter;

a sampler that performs first sampling for a signal, which has passed through the low pass filter or the band pass filter, at a sampling period of Ts; and a parallel sampled value generator provided in a stage following said sampler, wherein based on a first sampled value obtained by said sampler and the values of the interpolation function stored in said memory, said parallel sampled value generator generates a second sampled value of second sampling at said sampling period of Ts.

8. The parallel sampling device according to claim 7, wherein said memory stores the values of the interpolation function at an interval of $\Delta T$ which is $T_s/N \times M$, where N is an integer equal to or larger than 2 and M is an integer equal to or larger than 1, and when the second sampling is a plurality of samplings performed at an interval of Ts/N, said parallel sampled value generator generates the second sampled value based on the first sampled value and the values of the interpolation function at $t = \pm Ts/N, \pm 2Ts/N, \pm 3Ts/N, \ldots$.

9. A receiving device comprising:

a receiver that receives a radio frequency signal from a sending device and converts the signal to a baseband reception signal;

a memory that stores values of an interpolation function;

a low pass filter or a band pass filter to which an output of said receiver is supplied;

a sampler that performs first sampling for a reception signal, which has passed through the low pass filter or the band pass filter, at a sampling period of Ts;

a parallel sampled value generator provided in a stage following said sampler; and a signal regenerator provided in a stage following said parallel sampled value generator, wherein based on a first sampled value obtained by said sampler and the values of the interpolation function stored in said memory, said parallel sampled value generator generates a second sampled value of second sampling at said sampling period of Ts, and said signal regenerator regenerates a signal based on the first sampled value and the second sampled value.

* * * * *